(12) United States Patent
Seuntjens et al.

(10) Patent No.: US 6,397,454 B1
(45) Date of Patent: Jun. 4, 2002

(54) DECOUPLING OF SUPERCONDUCTING ELEMENTS IN HIGH TEMPERATURE SUPERCONDUCTING COMPOSITES

(75) Inventors: Jeffrey M. Seuntjens, Spencer; Craig J. Christopherson, South Grafton; Gregory L. Snitchler, Shrewsbury; William L. Barnes, Brockton; Kenneth DeMoranville, Jefferson, all of MA (US)

(73) Assignee: American Superconductor Corp., Westborough, MA (US)

( * ) Notice: Subject to any disclaimer, the term of this patent is extended or adjusted under 35 U.S.C. 154(b) by 0 days.

(21) Appl. No.: 08/719,987

(22) Filed: Sep. 25, 1996

(51) Int. Cl.$^7$ ............................................ H01L 39/24
(52) U.S. Cl. .................... 29/599; 174/125.1; 505/230; 505/231
(58) Field of Search ................... 29/599; 174/125.1; 505/230, 231

(56) References Cited

U.S. PATENT DOCUMENTS

| | | | |
|---|---|---|---|
| 4,929,596 A | * 5/1990 | Meyer et al. | ............ 29/599 X |
| 4,983,576 A | 1/1991 | Hagino et al. | |
| 4,990,491 A | 2/1991 | Wagner et al. | |
| 5,017,553 A | 5/1991 | Whitlow et al. | |
| 5,047,389 A | 9/1991 | Woolf et al. | |
| 5,057,489 A | 10/1991 | Ohkawa et al. | |
| 5,063,200 A | 11/1991 | Okhada et al. | |
| 5,075,285 A | 12/1991 | Flükiger | |
| 5,118,663 A | 6/1992 | Woolf et al. | |
| 5,261,151 A | 11/1993 | Ferrando et al. | |
| 5,296,456 A | 3/1994 | Shiga et al. | |
| 5,384,307 A | 1/1995 | Lay | |

FOREIGN PATENT DOCUMENTS

| | | | |
|---|---|---|---|
| EP | 0 503 525 A1 | 9/1992 | |
| EP | 0 627 773 A1 | 7/1994 | |
| EP | 0 638 942 A1 | 2/1995 | |
| EP | 0 650 205 A1 | 4/1995 | |
| EP | 0 803 917 | 4/1997 | |
| JP | 1-251518 | * 10/1989 | ............ 174/125.1 |
| JP | 5-211012 | * 8/1993 | |
| JP | 7014443 | 1/1994 | |
| JP | 6325629 | 11/1994 | |
| JP | 7065646 | 3/1995 | |
| WO | WO 96/28853 | 9/1996 | |

OTHER PUBLICATIONS

"AC Losses in Bi–2223 Composite Tapes" J.J. Gannon, Jr. et al., *Advances in Cryogenic Engineering*, 40, pp. 45–52 (1994).

"Skin Effect in a High–$T_c$ Flux–Flow Superconducting Wire" Yoichi Ando et al., *J. Appl. Phys.*, 70(8), pp. 4415–4420 (Oct. 15, 1991).

* cited by examiner

Primary Examiner—Carl J. Arbes
(74) Attorney, Agent, or Firm—Choate, Hall & Stewart

(57) ABSTRACT

An oxide superconducting cable is provided having a plurality of strands comprised of at least one oxide superconductor filament sheathed in a ductile and conductive metal matrix and least one of said strand further comprising a substantially continuous high resistivity coating substantially surrounding said at least one strand. The strands are positioned and arranged to form a cable. The cable is prepared by (a) applying a ductile predecessor coating to a plurality of strands, each said strand comprised of at least one oxide superconductor filament or a precursor thereto sheathed in a ductile metal matrix, and the ductile predecessor capable of conversion into a high resistivity material; (b) assembling the plurality of strands into a cable; and (c) converting the ductile predecessor into a high resistivity material, where steps (a) and (b) can be performed in any order.

56 Claims, 9 Drawing Sheets

DECOUPLING OF SUPERCONDUCTING ELEMENTS IN HIGH TEMPERATURE SUPERCONDUCTING COMPOSITES

FIELD OF THE INVENTION

This invention relates to oxide superconductor assemblies in which oxide superconducting elements are electrically decoupled from one another. The invention further relates to oxide superconductor conductors having high transverse matrix resistivity and methods of their making.

BACKGROUND OF THE INVENTION

Many applications of high temperature oxide superconductors involve conductor performance in time-varying magnetic fields with very stringent AC loss requirements. Mitigation of AC losses in superconducting oxides involves control over filament dimension, conductor matrix dimensions, matrix resistivities perpendicular to the magnetic field (transverse resistivity) and the critical current.

AC losses may be attributed to three different phenomena: hysteresis loss, eddy current loss, and coupling loss. Hysteresis loss describes the effect of a magnetic field on a superconducting filament due to hysteresis magnetization. Eddy current losses represent current loops in the matrix that create a magnetic field which opposes a change in the applied field. Coupling losses are similar to eddy current losses where a significant portion of the current loop may be loss-less inside two or more superconducting filaments in a multifilament composite.

Hysteresis loss is generated only in the superconductor filament and is predominantly proportional to filament dimension. Therefore, to mitigate hysteresis loss, it is desirable to reduce the filament diameter. Filament diameters on the order of 140 $\mu$m or less are considered minimally effective in the mitigation of hysteresis loss in oxide superconducting composites.

Eddy currents are generated only in the matrix and coupling currents involve current loops between two or more filaments connected through the matrix in a multifilamentary composite. Both eddy current losses and coupling losses are inversely proportional to the matrix resistivity. For coupling currents, the relevant resistivity is transverse to the filament axis. In addition, coupling losses depend upon the superconductor filament critical current density and the twist pitch of the filaments in the multifilamentary composite. Thus, AC losses due to coupling and eddy currents may be mitigated by decreasing the twist pitch of the superconducting filaments and increasing the resistivity (particularly the transverse resistivity) of the matrix.

Losses may be effectively mitigated only for twist pitches that are short relative to the diameter of the conductor composite. The twist pitch is defined as the longitudinal distance over which a filament traverses in a complete revolution around the conductor back to its angular starting point. As the twist pitch approaches the wire diameter, the angle of the filaments increases rapidly, as does the torsional strain, and the dependency of loss on twist pitch weakens.

The effective transverse resistivity is complicated by the unusual oxide superconductor grain morphology. Typically, both the overall composite and the superconducting filaments within the composite are aspected, with a cross sectional width, w, to thickness, d, ratio (w/d) on the order of 10 or more. Power losses are inversely proportional to the filament thickness (which scales as 1d) or width depending upon field orientation. To achieve the same loss level in a composite with an aspect ratio of 10, the matrix resistivity must be at least 100 times greater than in a non-aspected conductor.

Thus it is desirable to use fine dimension, twisted filaments in oxide superconducting composites having a high matrix resistivity. Because twisting becomes ineffective for twist pitches that approach the conductor's cross sectional dimensions and introduce filament strain, the most effective means of mitigating AC losses is to increase transverse resistivity of the matrix.

Attempts to prepare oxide superconducting composites with high matrix resistivities have been reported in the prior art. Many of the reported composites use a matrix alloyed with an element selected to reduce the overall conductivity of the matrix, e.g., Ag—X, where X is Au, Al, etc. Shiga et al. in U.S. Pat. No. 5,296,456 describe an oxide superconducting composite in which a ceramic superconductor is sheathed in a noble metal. The noble metal is alloyed with metals such as Zn, In, Cd, Cu, Mg, Be, Ni, Fe, Co, Cr, Ti, Mn, Zr, Al, Ga and rare earth elements to form a low conductivity layer. However, such alloys are not effective in reducing the conductivity of the matrix to levels considered effective for the mitigation of power losses. Further, both the longitudinal and transverse resistivity of the matrix is reduced. This is disadvantageous because it inhibits a high conductivity electrical shunt or current bypass should the superconducting pathway fail.

Sumitomo Electric Co. in EP 638,942 describe a twisted, multifilamentary oxide superconducting composite, in which each individual filament strand is surrounded by a 10 wt % Au/Ag alloy layer having a higher resistivity than the silver matrix. Such a composite suffers from several disadvantages. First, the Au—Ag alloy is of insufficient resistivity to mitigate AC losses in magnetic fields of 0.1–0.2 T, which is of interest in many applications. Secondly, the high resistance layer is directly surrounding the superconducting filament, precluding a more conductive silver matrix to act as a longitudinal electrical shunt in the event that a filament loses superconductivity. In addition, the resultant cable is very expensive to make.

Wagner et al. in U.S. Pat. No. 4,990,491 discloses a multifilamentary low temperature superconducting (LTS) wire ($Nb_3Sn$) with an outer NiO coating. Copper or bronze clad filaments are plated with a metallic nickel layer, which is then converted to NiO in the heat treatment used to form the $Nb_3Sn$. The architecture of the cable permits insulation of one multifilamentary strand from another, but does not decouple each superconductor filament as is required to mitigate coupling losses. Further, the AC losses in oxide superconductor composites are quite different than in low temperature superconductor (LTS) composites. The oxide superconductor filaments are usually larger and the matrix resistivity is smaller than in LTS composites. Weak links and the anisotropy of the high $T_c$ superconductor grains produce a critical current density ($J_c$) that varies with the local filament chemistry and grain orientation. Thus, composite geometries useful in the LTS field are not readily applicable to the oxide superconductor composites.

Other references report the use of insulating layers or sheets in the construction of a multifilamentary oxide superconductor composite. EP 503,525 describes a multifilamentary composite in which an intermediate layer made up of a high resistance metal, such as CuNi, is placed between multifilamentary tapes making up the composite. Only low level loss reduction is achieved. While this reduced coupling between multifilamentary tapes, it does not satisfactorily reduce losses within each tape.

In a similar fashion, EP 650,205 describes multifilamentary oxide superconductor composite tapes prepared from multiple tape layers spirally wound on a cable form. In order to reduce AC losses due to coupling between multifilamentary tapes, an intermediate insulating layer is wound between individual tape windings. As in EP 503,525, this architecture may reduce coupling between multifilamentary tapes, but it does not reduce losses within each tape.

Thus, the prior art attempting to increase the resistivity between individual superconducting filaments for the mitigation of AC losses has not been satisfactory. There remains a need to provide an oxide superconductor composite which possesses sufficient transverse matrix resistivity to reduce AC power losses, but which retains sufficiently low longitudinal resistivity in contact with the superconducting filament to serve as a conductive shunt. Furthermore, such a composite should be prepared under a cost-effective, manufacturing condition.

SUMMARY OF THE INVENTION

It is the object of the present invention to provide an oxide superconducting composite which possesses a high transverse matrix resistivity, but which retains sufficiently low longitudinal resistivity in contact with the superconducting filament to serve as a conductive shunt.

It is a further object of the present invention to provide a superconducting composite having the above features and having sufficient toughness and flexibility to be assembled into a cable.

It is a further object of the present invention to prepare a high resistivity layer within an oxide superconductor composite.

It is yet a further object of the invention to prepare a high resistivity layer onto each strand of an oxide superconductor composite cable so as to electrically decouple the superconducting filaments.

These and other objects of the invention will be made clear with reference to the description of the invention which follows.

In one aspect of the invention, an oxide superconducting cable, is provided having a plurality of strands comprised of at least one oxide superconductor filament sheathed in a ductile and conductive metal matrix, at least half of strands further comprising an adherent, substantially continuous high resistivity coating substantially surrounding said at least half of said strands, wherein the strands are positioned and arranged to form a cable.

In another aspect of the invention, a cable is provided having a plurality of strands, each of said strand comprised of at least one filament comprised of a precursor to an oxide superconductor sheathed in a ductile and conductive metal matrix. At least half of said strands further comprise an adherent, substantially continuous metal coating on the outer surface of said at least half of said strands, said metal capable of conversion into a high resistivity material, wherein the strands are positioned and arranged to form a cable.

In yet another aspect of the invention, a cable is provided having a plurality of strands, each of said strands comprised of at least one filament comprised of a precursor to an oxide superconductor sheathed in a silver-based matrix. At least one of said strands further comprising an adherent, substantially continuous silver-based intermetallic material coating on the outer surface of said strand, said intermetallic material capable of conversion into a high resistivity material, wherein the strands are positioned and arranged to form a cable. Another aspect of the invention includes an oxide superconducting strand at least one oxide superconductor filament sheathed in a ductile and conductive metal matrix and an adherent high resistivity coating substantially surrounding the outer surface of the sheathed filament. An oxide superconducting cable of the invention is characterized in that the AC losses at an alternating magnetic field of 0.1 T rms is less than about 10 mW/A-m. The strand has a superconducting oxide volume fraction of about 0.1 to about 0.5, and preferably of about 0.25 to about 0.4.

As used herein "filament" refers to a single, substantially continuous elongated oxide superconductor domain. Further, reference to a "superconducting filament" or an "oxide superconducting filament" and the like includes filaments made up of a precursor to the desired oxide superconductor. A "superconductor precursor" as that term is used herein, is meant any material (e.g., metals, salts or oxides) that can be converted into the desired oxide superconductor by heat treatment under suitable conditions. "Matrix" refers to a material or homogeneous mixture of materials which supports or binds the superconducting oxides or their precursors disposed within or around the matrix because of their malleability and low resistivity. By "conductive metal matrix" as that term is used herein, it is meant a metal matrix sufficiently conductive so that it may act as a longitudinal electrical shunt. Thus, the conductive metal matrix preferably does not have a resistivity greater than about 5 $\mu\Omega$-cm. "High resistivity", as the term is used herein, means a resistivity greater than 100 $\mu\Omega$-cm, and preferably in the range of about 1 m$\Omega$-cm to 1 $\Omega$-cm.

"Strand" refers to one or more filaments substantially surrounded or supported by a metal matrix. A "monofilament" strand refers to a strand containing a single filament. A "multifilament" strand refers to strand containing two or more filaments embedded in or supported by the same metal matrix. A "cable", "cabled conductor" or "cable composite" as those terms are used herein means an assembly of strands, which may be monofilamentary or multifilamentary, created by transposing or otherwise arranging the strands in conventional cable architectures.

In preferred embodiments, each strand of the cable is substantially surrounded, and preferably diffusion bonded, by the high resistivity coating. Each strand may be diffusion bonded to a neighboring strand. The strand may be a monofilament, a multifilament or a preassembled cable.

In other preferred embodiments, the high resistivity coating of the cable comprises a metal oxide, preferably selected from the group consisting of oxides of tin, bismuth, gallium, antimony, zinc, iron, nickel, niobium, tantalum, zirconium and indium and alloys thereof with each other and silver. The coating thickness is in the range of about 1 $\mu$m to about 5 $\mu$m and preferably in the range of about 2 $\mu$m to about 3 $\mu$m. In preferred embodiments, the high resistivity coating has a resistance greater than about 10 $\mu\Omega$-cm, and preferably greater than about 1 m$\Omega$-cm, but less than about 10 $\Omega$-cm.

In other preferred embodiments, the filament diameter is less than 250 $\mu$m, preferably less than 140 $\mu$m and even more preferably less than 100 $\mu$m. In other preferred embodiments, the cable strands are positioned and arranged so as to form a cable selected from the group consisting of concentric, bunched and rope lay cables and higher order cables form therefrom.

In other preferred embodiments, the high resistivity layer comprises two substantially continuous layers having a conductive metal layer disposed therebetween. Non-continuous domains of the high resistivity material may be dispersed within the conductive metal matrix in an amount insufficient to significantly increase the resistivity of the conductive metal matrix. In other embodiments, the cable has an aspect ratio of greater than one.

In yet another aspect of the invention a method is provided for the manufacture of a superconducting article having a high transverse matrix resistivity. A ductile predecessor coating is applied to a plurality of strands, each said strand comprised of at least one oxide superconductor filament or a precursor thereto sheathed in a ductile and conductive metal matrix, wherein the ductile predecessor is capable of conversion into a high resistivity material, assembling the plurality of strands into a cable and converting the ductile predecessor into a high resistivity material, wherein the first and second steps can be performed in any order. A method is provided for the manufacture of a superconducting article comprising fine filaments and a high resistivity layer which maintains filament integrity and the integrity of the high resistivity layer throughout the manufacturing process.

In yet another aspect of the invention, an oxide superconducting cable having a high transverse matrix resistivity is prepared by cabling a plurality of strands, each said strand comprised of at least one oxide superconductor filament or a precursor thereto sheathed in a conductive metal matrix, contacting the cable with a ductile predecessor so as to form a ductile predecessor layer on the cable strands, wherein the ductile predecessor is capable of conversion into a high resistivity material, and converting the ductile predecessor into a high resistivity material.

In preferred embodiments, the ductile predecessor is converted into a high resistivity material by oxidizing the metal into the corresponding metal oxide. In other preferred embodiments, the ductile predecessor layer is applied by contacting the filaments with the ductile predecessor in a molten or liquid form, electroplating, ion implantation, physical vapor deposition, electroless deposition.

In preferred embodiments, the method further comprises heating the coated cable after assembly of the cable to adhere the strands to each other. The heat treatment may occur at a temperature at about or above the melting point $T_m$ of the ductile predecessor.

In preferred embodiments, the conversion step is carried out at superatmospheric oxygen pressures and at a temperature sufficient to convert to the ductile predecessor into a high resistivity material, wherein preferably the oxygen pressure is in the range of 15–3000 psi, and wherein preferably the total pressure is in the range of about 15–60,000 psi. The temperature is in the range of about 400° C. to about 700° C. In other preferred embodiments, the conversion step is carried out under conditions additionally sufficient to convert the oxide superconductor precursor to the oxide superconductor.

In another preferred embodiment, the cable is further heated under temperatures and pressures sufficient to convert the oxide superconducting precursor to the oxide superconductor. In another preferred embodiment, the cable is further subjected to deformation processing sufficient to texture the oxide superconductor or precursor thereto, said deformation processing occurring prior to the conversion of the ductile predecessor into a high resistivity material. The deformation includes rolling, pressing, turks heading, drawing, extruding and twisting. In other preferred embodiments, the strand is twisted prior to the cabling step. In other preferred embodiments, the high resistivity coated cable is subjected to a heat treatment selected to heal microcracks in the oxide superconductor.

BRIEF DESCRIPTION OF THE DRAWING

The invention is understood with reference to the Figures, which are presented for the purpose of illustration only, which are in no way intended to be limiting of the invention and in which.

DETAILED DESCRIPTION OF THE INVENTION

Figure 1:
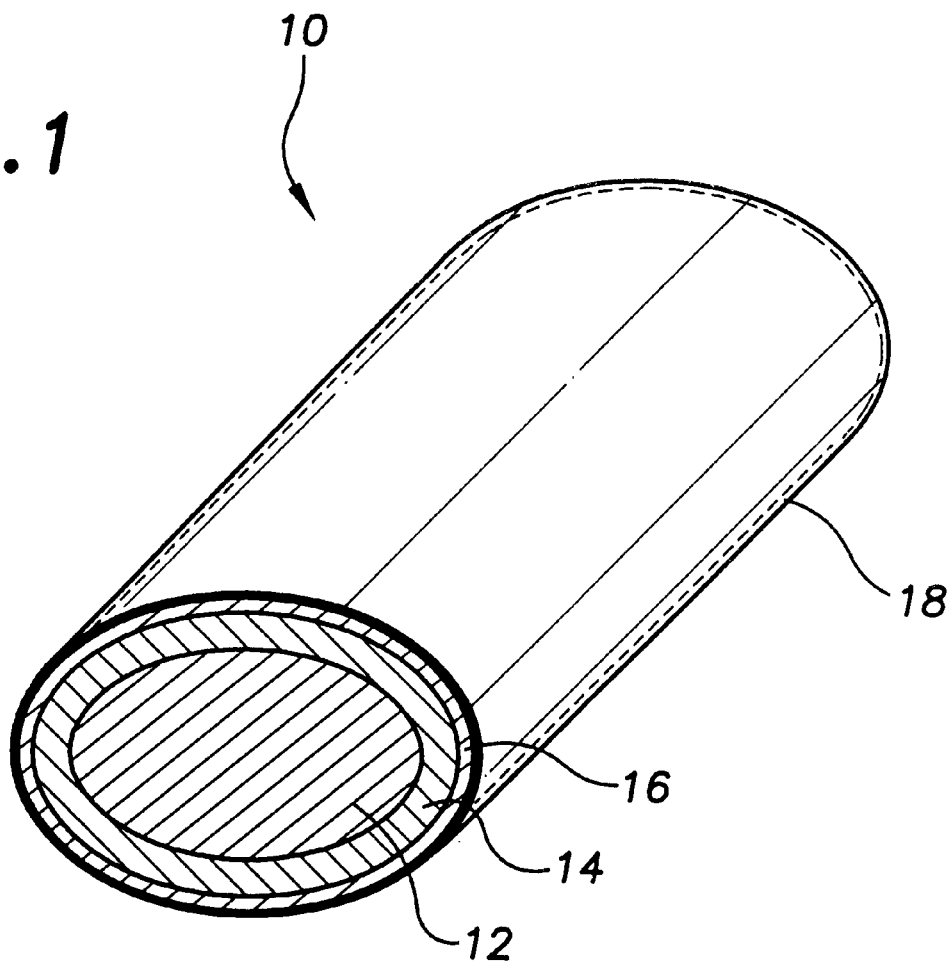
FIG. 1 is a perspective view showing an oxide superconductor article in accordance the invention.

The present invention provides an oxide superconductor composite article comprising an oxide superconductor filament embedded in a conductive metal matrix. The oxide superconductor article possesses an adherent outer coating of significantly higher resistivity than the conductive metal. The high resistivity layer is diffusion bonded to the metal matrix, resulting in a tough, spall-resistant coating. A preferred embodiment of the invention is illustrated in FIG. 1 in which an oxide superconductor strand 10 comprising an oxide superconducting or (precursor thereto) filament 12 embedded in a conductive, ductile metal matrix 14. The strand 10 may include one or more filaments 12. The strand 10 further includes an adherent high resistivity layer 16 substantially continuously covering the outer surface of the strand. It is preferred that the article have a fine filament because it has been established that smaller filament dimensions reduce hysteresis losses. In particular, it is preferred that the longest cross-sectional area filament dimension be less than 250 μm, preferably less than 140 μm and most preferably less than 100 μm. Note that these are the final filament dimensions and may be greater during processing. In other preferred embodiments, a conductive jacket 18 surrounds the high resistivity layer 16. The strand may be a wire or tape or other aspected geometry.

Conductors which are flexibly cabled, that is, composed of twisted helically wound, braided or otherwise transposed bundles of mechanically and electrically isolated conductor strands, are desired in many electrical applications, including coils, rotating machinery and long length cable. Thus, in another aspect of the invention, a cabled conductor having electrically decoupled superconducting oxide domains is provided. A multifilamentary composite cable comprises a plurality of strands, each strand including at least one oxide superconductor filament embedded in a conductive metal matrix. At least one, and preferable, each strand is electrically decoupled from other strands by a high resistivity metal oxide layer which is deposed between and substantially surrounding each strand. The high resistivity layer forms a "web" which extends through out the cable composite.

Figure 2:
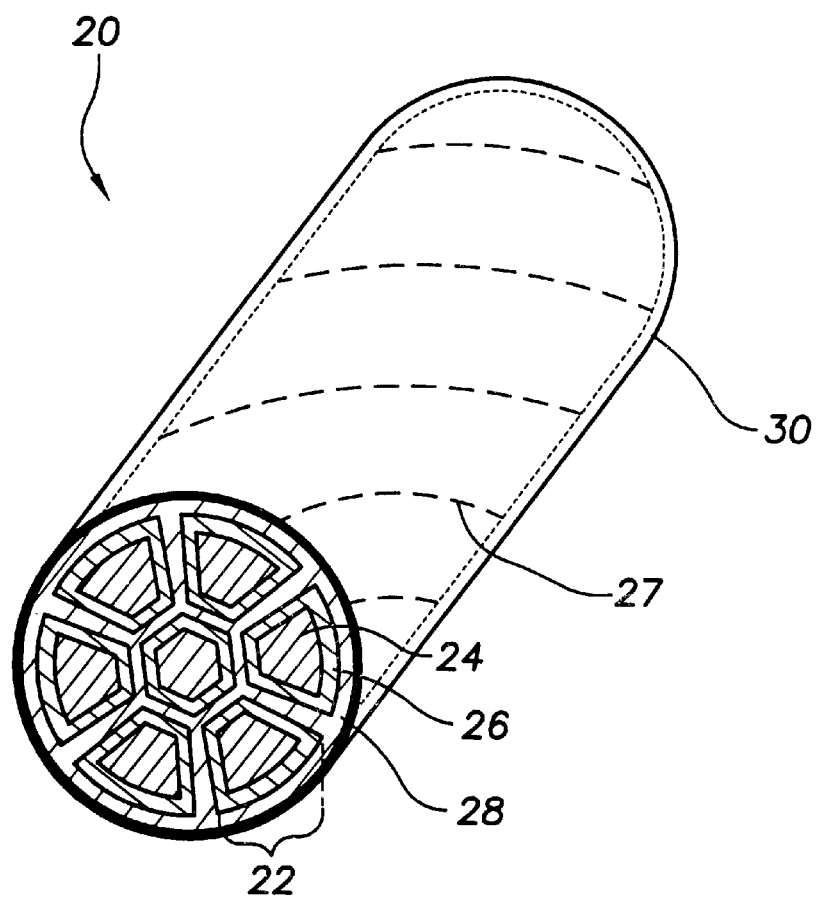
FIG. 2 is a perspective view showing an oxide superconductor cable in accordance with the invention.

As illustrated in FIG. 2, an oxide superconductor cable 20 comprises a plurality of transposed strands 22 in which each strand contains one or more oxide superconductor filament 24 embedded in a conductive metal matrix 26. Dashed lines 27 indicate transposition of the strands 22 within the cable. Each strand 22 has an adherent coating 28 of significantly higher resistivity than the conductive metal matrix 26 substantially covering the strand's outer surface and deposed between neighboring strands. The higher resistivity of the outer coating 28 electrically decouples each oxide superconductor strand from its neighboring strands. When the strand is a monofilament strand, each filament of the cable is electrically decoupled. In preferred embodiments, the high resistivity coating 28 is metallurgically bonded to its strand and is preferably well adhered to the adjacent strands. In other preferred embodiments, a conductive jacket 30 surrounds the cable 20.

In a preferred embodiment of the invention, the strands are monofilaments and contain only a single oxide filament within a single conductive metal domain. Thus there are no conductive pathways for induced currents over dimensions much larger than the filament dimensions. For AC loss purposes, it is preferred that individual strands and/or the cable is twisted.

In another preferred embodiment, the strands of the cabled conductor are comprised of individual strands which have been transposed, helically wound, braided or otherwise transposed to form a cable, i.e., "a cable of cables". At least one, and preferable, each cabled strand is electrically decoupled from the other cabled strands by a high resistivity metal oxide layer which is deposed between and substantially surrounding each strand. Each of the individual cabled strands possess a high resistivity layer as described above for a simple cable. Thus, complex higher-order cables may be provided in which each oxide filament is electrically decoupled from each other filament, if desired.

In preferred embodiments, the adherent coating has a resistivity in the range of greater than about 100 $\mu\Omega$-cm and preferably in the range of about 10 m$\Omega$-cm-1$\Omega$-cm. It has been determined that resistivity on the order of about 100 $\mu\Omega$-cm is effective in order to be effective in mitigating eddy current and coupling losses in a magnetic field of 0.1 T (B $\perp$ aspected filament) with an aspect ratio (width/thickness) of about 15. Furthermore, for a twist pitch of 2 cm for a commercial scale conductor cross section and an aspect ratio of 10, an effective resistivity between adjacent filaments on the order of 500 $\mu\Omega$-cm may be achieved by this invention. This resistivity value is significantly higher than those reported for silver (0.3 $\mu\Omega$-cm), noble metal-silver alloys (<10 $\mu\Omega$-cm) and oxide dispersed silver (ODS, 1.5–2 $\mu\Omega$-cm). Oxide dispersed silver contains small oxide particles dispersed throughout the silver matrix, which increases the hardness and mechanical strength of the matrix. Because the oxide domains are small and non-continuous, they do not significantly increase the resistivity of the silver matrix.

The coating layer should be thick enough to yield the desired resistivity. However, it should not be so thick as to render the layer completely insulating in order to retain the ability to current share between filaments in the event of filament defects. Thus, a superconducting domain may be substantially electrically decoupled from adjacent domains. Coating thicknesses in the range of about 1 $\mu$m to 5 $\mu$m thick, and preferably in the range of about 2 $\mu$m to 3 $\mu$m, are suitable. It is preferred that the high resistivity coating substantially completely cover the outer surface of the strand and that the coating be substantially continuous. In other preferred embodiments, the high resistivity coating is diffusion bonded to the outer surface of the strand.

The high resistivity coating may be a metal oxide, metal carbide, metal nitride, metal sulfide and the like, so long as the material has the requisite resistivity. The high resistivity coating is preferably a metal oxide. In preferred embodiments, the high resistivity coating is comprised of one or more oxide of tin, indium, bismuth, gallium, antimony, zinc, iron, nickel, niobium, tantalum or zirconium. The particular material used as the high resistivity layer depends upon the anticipated use of the oxide superconductor article and the method by which it is produced. In some preferred embodiments, the layer may be tin oxide or indium oxide.

The strands may include any desired oxide superconductor. By "desired oxide superconductor", as that term is used herein, it is meant the oxide superconductor intended for eventual use in the finished product. Typically the desired oxide superconductor is selected for its superior electrical properties, such as high critical temperature or critical current density. The filament may, of course, comprise any oxide superconductor, such as by way of example only, oxide superconductors of the rare earth-barium-cuprate family of superconductors (ReBCO), the bismuth-strontium-calcium-cuprate family of superconductors (BSCCO), the thallium-strontium-calcium-barium-cuprate (TBSCCO) and the mercury-barium-strontium-calcium-cuprate (HBSCCO) family of superconductors. In preferred embodiments, the method is practiced using monofilaments of the oxide superconductor precursor $(Bi,Pb)_2Sr_2Ca_1Cu_2O_y$ (BSCCO 2212), which is converted into the desired oxide superconductor $(Bi,Pb)_2Sr_2Ca_2Cu_3O_y$ (BSCCO 2223) in subsequent heat treatments. In another preferred embodiment, the method is practiced with $Re_1Ba_2Cu_3O_y$ (ReBCO 123) or $Re_2Ba_4Cu_7O_y$ (ReBCO 247) as the desired oxide superconductor.

The filaments may contain a precursor to the desired oxide superconductor which is converted in a subsequent processing step into the desired oxide superconductor phase. Precursors may include any combination of elements, metals, salts, oxides suboxides, oxide superconductors which are intermediate to the desired oxide superconductor, or other compounds which, when reacted in the presence of oxygen in the stability field of a desired oxide superconductor, produces that superconductor. For example, there may be included elements, salts or oxides of copper, yttrium, neodynium or other rare earth elements, and barium for the rare earth family of oxide superconductors; elements or oxides of copper, bismuth, strontium and calcium and optionally lead for the BSCCO family of superconductors; elements or oxides of copper, thallium, calcium and barium or strontium and optionally bismuth and lead, for the TBSCCO family of oxide superconductors; elements, salts or oxides of copper, mercury, calcium, barium or strontium, and optionally, bismuth and lead, for the HBSCCO family of oxide superconductors. The bismuth and rare earth families of oxide superconductors are most preferred for operation of this invention.

The filaments may contain a superconducting oxide intermediate. The formation of a superconducting oxide intermediate may be desired in some circumstances in order to take advantage of desirable processing properties of the intermediate, for example, a micaceous structure which may not be equally possessed by the desired oxide superconductor or a cleaner phase conversion from precursor oxides or salts.

The three-layer high-$T_c$ phase of the BSCCO family of oxide superconductors (BSCCO 2223), such as $B_2Sr_2Ca_2Cu_3O_y$ or $(Bi,Pb)_2Sr_2Ca_2Cu_3O_y$, is the desired superconducting oxide most preferred for the operation of the present invention. Composites including BSCCO 2223, ReBCO 123 and ReBCO 247 have demonstrated the potential for superior mechanical operation and electrical performance at long lengths when adequately textured and should be well suited for use in the present invention. The current-carrying capacity of a superconducting oxide composite depends significantly on the degree of crystallographic alignment and intergrain bonding of the oxide grains, together known as "texturing", induced during the composite manufacturing operation. For example, known techniques for texturing the two-layer and three-layer phases of BSCCO 2212 and BSCCO 2223 are described in Tenebrink, Wilhelm, Heine and Krauth, *Development of Technical High-$T_c$ Superconductor Wires and Tapes,* Paper MF-1, Applied Superconductivity Conference, Chicago (Aug. 23–28, 1992) and Motowidlo, Galinski, Hoehn, Jr. and Haldar, *Mechanical and Electrical Properties of BSCCO Multifilament Tape Conductors,* presented at the Materials Research Society meeting Apr. 12–15, 1993. Alignment of the BSCCO 2223 phase in a cabled conductor is described in co-pending U.S. Ser. No. 08/554,814 filed Nov. 7, 1995, and entitled "Cabled Conductors Containing Anisotropic Superconducting Compounds and Method for Making Them", which is incorporated herein by reference.

By "matrix" as that term is used herein, it is meant a material or homogeneous mixture of materials which supports or binds the superconducting oxides or their precursors disposed within or around the matrix, selected because of their malleability and low resistivity. Multilayer matrices are also contemplated. Metals are typically used as the matrix. Silver and other noble metals are the preferred matrix materials, but alloys substantially comprising noble metals, including ODS silver, may be used. "Noble metals" as that term is used herein is meant a metal which is substantially non-reactive with respect to oxide superconductors and precursors and to oxygen under the expected conditions (temperature, pressure, atmosphere) of manufacture and use. Preferred noble metals include silver (Ag), gold (Au), platinum (Pt) and palladium (Pd). Silver and its alloys, being lowest in cost of these materials, are most preferred for large-scale manufacturing.

Co-pending U.S. application Ser. No. 08/444,564 filed May 19, 1995 and entitled "A Novel Structure and Method of Manufacture for Minimizing Filament Coupling Losses in Superconducting Oxide Composite Articles" describes a superconducting composite in which oxide superconducting domains supported in a metal matrix are electrically decoupled by placement of decoupling layers within the metal matrix. Each superconducting domain is made up of one or more oxide superconducting filaments. The decoupling layers are initially positioned in the composite as metal sheets or foils, and are then converted into the corresponding metal oxide, sulfide, nitride or intermetallic which serves as the decoupling layer. The geometries (positioning of the decoupling layers relative to the superconducting domains) described in U.S. Ser. No. 08/444,564 for AC loss mitigation are complex—all the more so where it is desired to electrically decouple individual oxide superconducting filaments. In order to ensure that there is no mechanical failure of the composite during processing of these complex geometries into the final composite article, the decoupling layer must be well adhered to the metal matrix. However, the composites disclosed in U.S. Ser. No. 08/444,564 do not provide the requisite strong decoupling layer/metal matrix interface.

Co-pending U.S. application Ser. No. 08/554,814 describes a cabled conductor of transposed strands containing filaments in a supporting metal matrix. The oxide grains of the filaments are crystallographically aligned so that they are substantially unidirectional and independent of the rotational orientation of the strands and filaments in the cabled conductor. Many of the texturing techniques used to obtain such unidirectional orientation described therein may be applied to the cables prepared according to the present invention and are herein incorporated by reference. U.S. Ser. No. 08/554,814 also discloses that each cable strand may be coated with an insulating layer prior to cabling so that the strands in the finished cable will be eclectically isolated. Suitable insulating material includes metal oxides, nitrides and carbides, such as magnesium oxide, tin oxide, boron nitride and silicon carbide. Such a coated cabled conductor suffers from the limitations described herein, namely, that strands coated with a brittle coating prior to the cabling operation can not be carried through the manufacturing process without unacceptable cracking and spalling. Thus, the high resistivity coating of the product cabled conductor is not well adhered.

The present invention overcomes this problem by forming a metallurgical bond between the high resistivity coating and the strands which is resistant to spalling or fracture of the coating. The cable is prepared by coating superconducting oxide strand with a thin layer of a ductile predecessor material which is converted in a subsequent step into a high resistivity layer. Because of its ductility, the predecessor layer may be carried through the many mechanical deformation steps used in the preparation of an oxide superconductor composite. The strand may be cabled at any time before conversion of the ductile material into the high resistivity material, however, it is preferred that the filaments are assembled into a cable before application of the ductile material layer.

The present invention has identified ductile predecessor materials suitable for application to the filaments. A suitable material desirably allows processing in a transposed multifilament assembly (a cable) and should be convertible into a very high resistivity layer between the filaments without significant compromise to the filament critical current density ($J_c$) or composite critical current density ($J_e$). $J_e$ is defined as the critical current per cross sectional area of the overall composite, whereas $J_c$ is defined as the critical current per cross sectional area of the oxide superconductor phase. Additionally, the ductile coating material may have some or all of the following attributes: (1) high ductility in the as-applied condition, (2) uniform and controllable thickness, (3) chemical compatibility with the oxide superconductor so as not to promote filament degradation, (4) minimal cross sectional area so as not to reduce $J_e$, and (5) convertible into a material with acceptably high resistance.

The coating is desirably ductile due to the many manipulations and deformations under which the cable may be subjected to during processing. The predecessor material is desirably sufficiently ductile and adherent to withstand cabling operations and deformation operations used to promote texture and to twist transpose the filaments. In addition, the mechanical properties of the ductile predecessor are desirably similar to the silver matrix, so that the two respond in a similar manner upon deformation processing.

As mentioned in the Background of the Invention, no metal or metal alloy has been identified with sufficient resistivity to be a suitable coating. Ceramic oxides, on the other hand, are typically insulators and should have the requisite resistance for the adherent layer. Yet, ceramic oxides are brittle and lack sufficient ductility to be co-deformed with the silver matrix. The present invention has identified metals and metal alloys which meet the ductility and co-deformability requirements for the coating and which may be subsequently converted into high resistance metal oxides.

In one embodiment of the invention, the ductile predecessor coating may be prepared from metals which are immiscible in the matrix silver, such as iron (Fe), nickel (Ni), niobium (Nb), tantalum (Ta) and zirconium (Zr). These metals are advantageous in that they do not diffuse into silver at elevated processing temperatures. However, each of these metals have a higher anneal yield strength and higher work hardening rates than the precursor oxide strand which makes the processing of the thin, closely spaced layers of these materials in the composite difficult. This embodiment is particularly appropriate for strands and cable composites in which decoupling of bundles of filaments, and not each and every filament, is sufficient. In such instances, it is anticipated that the co-deformation strain may be low.

In another embodiment of the invention, the ductile predecessor coating may be prepared from metals which are miscible in the silver matrix, but which either do not adversely affect the superconducting properties of the filament or which can be maintained physically separated from the superconducting filament by intervening silver. In this situation, the transformation of the ductile metal coating into a ceramic oxide will be a reaction kinetics competition between oxidation to the metal oxide and diffusion of the metal into the silver matrix. Suitable metals which meet this criteria include, tin (Sn), indium (In), gallium (Ga), bismuth (Bi), antimony (Sb) and alloys thereof with themselves and/or with silver. Low melting point metals, Sn and In, and eutectic alloys of Sn and In with silver are most preferred. Particularly preferred is the eutectic alloy of Sn and Ag ($T_m$ 221° C.; 96.5 wt % Sn), known commercially as staybrite. Staybrite affords excellent ductility, higher strength than pure tin, and has a low work hardening rate. An indium-silver eutectic alloy ($T_m$ 144° C., 96 wt % In) is also a preferred embodiment.

The metal layer may be applied according to many conventional methods, including but not limited to, plating, atomic and molecular deposition techniques, and soldering techniques. Soldering techniques are preferred when a ductile metal coating is prepared from metals miscible in the conductive metal on the surface of the strand. However, such a technique may not be suitable for metals immiscible with the conductive metal because the immiscibility of the two materials may cause beading of the molten metal and provide poor coverage of the strand surface. In the cases using immiscible metal coatings, electrochemical deposition and/or physical plating techniques may be preferred.

Figure 3:
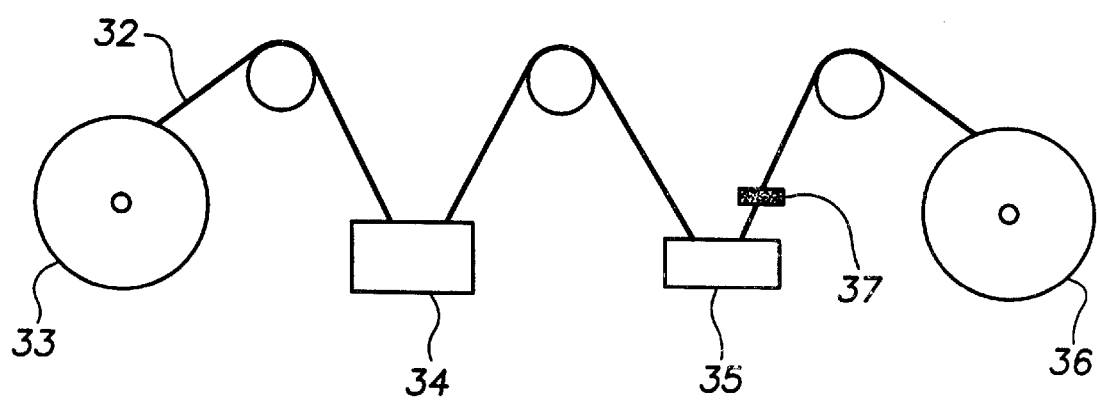
FIG. 3 is a schematic illustration of a coating operation used in the practice of the invention.

With reference to FIG. 3, the soldering technique forms a metal layer on individual strands by passing strands or assembled cables of superconducting strands through a conventional soldering pot. The strands or cables 32 are fed off of a spool 33 and, optionally, through a flux-filled bath 34. The strands 32 are then fed through a solder bath 35 and onto a take up spool 36. The thickness of the coating may be readily controlled by wiping the strand at station 17 as it leaves the soldering pot containing the molten metal. Solder infiltration occurs rapidly, for example, after about a few seconds or less of immersion in solder bath, presumably due to the miscibility of the molten metal solder. Surface tension maintains a thin uniform coating on the strand. Molten metal contact with silver forms a metallurgical bond between silver and the coated metallic layer to form an adherent coating. Formation of a strong adherent coating at this early stage in the processing of an oxide superconducting article permits the article to be subjected to deformation processes not heretofore thought possible for a coated, cabled article.

In accordance with the method of the invention, the filament strands may be coated at any one of several points during the cabling operation: (1) prior to the cabling operation, (2) after the cabling operation, but before drawing, (3) after drawing the assembled cable or (4) after roll deformation.

Strands are effectively coated when the coating operation is conducted prior to cabling. Individual strands may be coated by contacting each filament individually with a molten metal bath. In addition, many more coating techniques, i.e., solution deposition, plating, physical implantation, etc., are amenable to the coating of a single strand and thus the process is extremely flexible. However, because the coated strands are not bonded in any way to their neighboring strands after cabling, there can be undesirable movement and slipping of the strands during subsequent deformation processing. This may be addressed by adjusting the magnitude of deformation stress.

Coating of cabled assemblies has the disadvantage as compared to coating of individual strands in that fewer coating methods are available to effectively coat the transposed strands. However, it has been demonstrated that cabled strands may be effectively coated by immersion of the cable in a molten metal solder bath. Capillary action and the wicking effect (surface tension) draws the molten metal up between the assembled strands to form a substantially continuous coating of uniform thickness. Furthermore, because the coatings may bond neighboring strands, the cable is more robust during subsequent deformation processing.

A particularly preferred method of coating the superconducting filaments is to first draw the cable down to a smaller cross section, before coating in a molten metal bath. Because there is no metallurgical bond between the individual cable strands, capillary action effectively draws an even and continuous metal coating over each strand. Drawing the cable before coating reduces the void space within the cable and therefore minimizes the pooling of molten metal in these void spaces which, if present, would result in an uneven coating layer.

One or more drawing steps are contemplated. In preferred embodiments, a series of small reduction drawing steps preferably less than about 20% per step are used rather than a single large reduction drawing step. At this point in the process the individual strands have not yet been metallurgically bonded to each another and there is a tendency for the strands to slip and bunch up unevenly. By applying a series of small reduction, the tendency for slipping is reduced. Uneven drawing may be further avoided by applying a back tension on the cable as it passes through the die. Back tension compresses the stands and minimizes distortion. In addition, it is contemplated that the cable may be twisted (to induce torsional texture and/or reduce AC losses) during the drawings step. The cable may be twisted during every drawing pass, alternate passes or at set incremental passes. In a preferred embodiment, the cable is drawn through two passes, annealed to soften the silver matrix, and twist/drawn in the third drawing pass. The three pass process may be repeated, as needed. In a typical operation, the cable diameter is reduced by about 2 or more in diameter.

It is also contemplated within the scope of the invention to roll, turks-head roll or press the cable before coating. This can be carried out on an as-cabled or drawn cable. Aspect ratios of up to about three may be tolerated at this step of the process. The resultant rectangular geometry has a greater surface area than the round geometry, above, and any resultant coating may contain more material. It is within the scope of the invention to employ a rectangular die or other modified wiping mechanism which will more efficiently remove excess coating layer from the cable.

Figure 4:
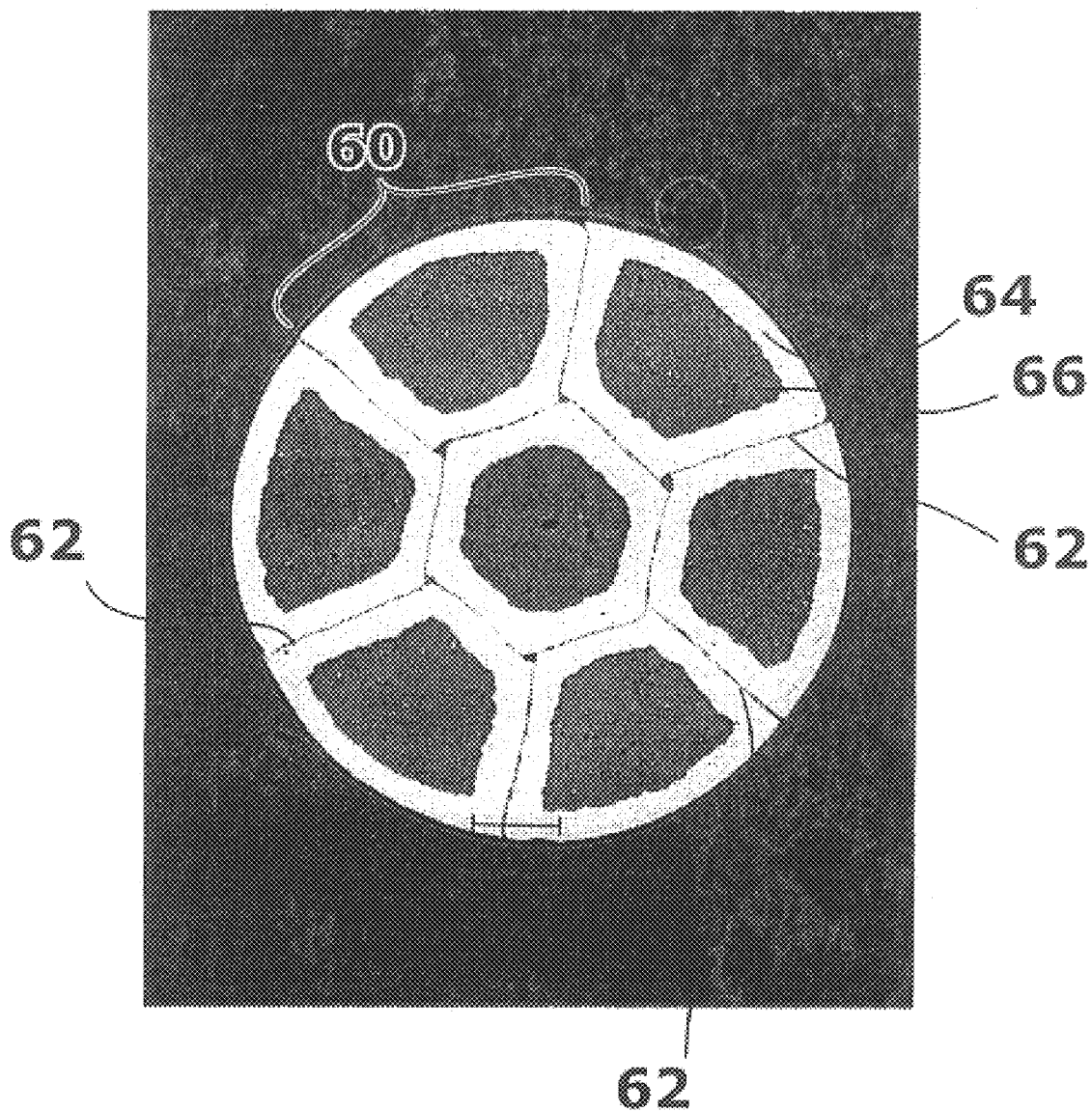
FIG. 4 is a light photomicrograph of an AgSn-coated cable cross section which was drawn to reduce void space prior to coating.

FIG. 4 is a light photomicrograph of a cable cross section after coating by immersion in a staybrite solder bath. The cable was drawn prior to solder coating and the individual strands 60 have taken on a flat-surface geometry which reduces void space. A staybrite coating 62 completely covers each monofilament strand 60 and forms a continuous web of metal throughout the cabled composite. Light colored layer 64 is the silver matrix and a dark center 66 is the superconducting oxide filament.

The invention may be practiced with any form of composite strand, for example, a multifilamentary wire, monofilamentary wire, cabled wire or a sandwiched laminate. The strands may be prepared by any conventional means, including physical film forming techniques such as sputtering or ion beam assisted deposition (IBAD), chemical film forming methods such as chemical vapor deposition (CVD) or the well known powder-in-tube (PIT) process.

It is preferred to use wire strands having fine filaments in the practice of the invention because it has been established that smaller filament dimensions reduce hysteresis losses. In particular, it is preferred that the largest cross-sectional filament dimension (i.e., width) in the final article be less than 250 $\mu$m, preferably less than 140 $\mu$m and most preferably less than 100 $\mu$m. Note that these are the final filament dimensions. Filament dimensions may be reduced significantly by extrusion and drawing operations. Thus, it is within the scope of the invention to prepare strands having filaments of greater dimensions and reduce the filament dimension during processing.

A combination of reduction schedules and die angles has been found to allow for multi-die processing of monofilament material on a fine wire machine. A "full-slip" class of multi-die drawing is used, in which the wire is fed from a first rotating drum, passes through a first die and around a second rotating barrel and back to the first rotating drum, and then passes through a second die. The process is continued through successive dies until the desired wire thickness is achieved. The process is called full slip because the drum diameter is not compensated for varying wire speeds as the wire elongates. "Half-slip" and "no slip" drawing is also contemplated. Occasional anneals at about 300° C. for 5—30 minutes are desirable to soften the silver matrix. Note that the final filament dimension is much less (ca. 100 $\mu$m) due to symmetric and asymmetric deformation carried out during processing of the composite, as discussed below. Either partially aspecting the strands, partially pre-texturing the filaments, or both, prior to strand transposition is within the scope of the invention.

The as-prepared filament strand, coated or uncoated, is cabled using conventional cabling methods. Such round stranded assemblies are common to the conventional wire and cable industry and are referred to as concentric stranded cables. Strands may be cables at high packing factors on conventional cabling equipment such as that supplied by the Entwhistle Company of Hudson, Mass. Planetary or rigid cabling equipment may be used. In addition, complex cables may be formed, in which cables themselves are used as strands in the cabling operation. The strands may be fabricated in accordance with the cabling parameters generally specified for the particular piece of equipment.

Figure 5:
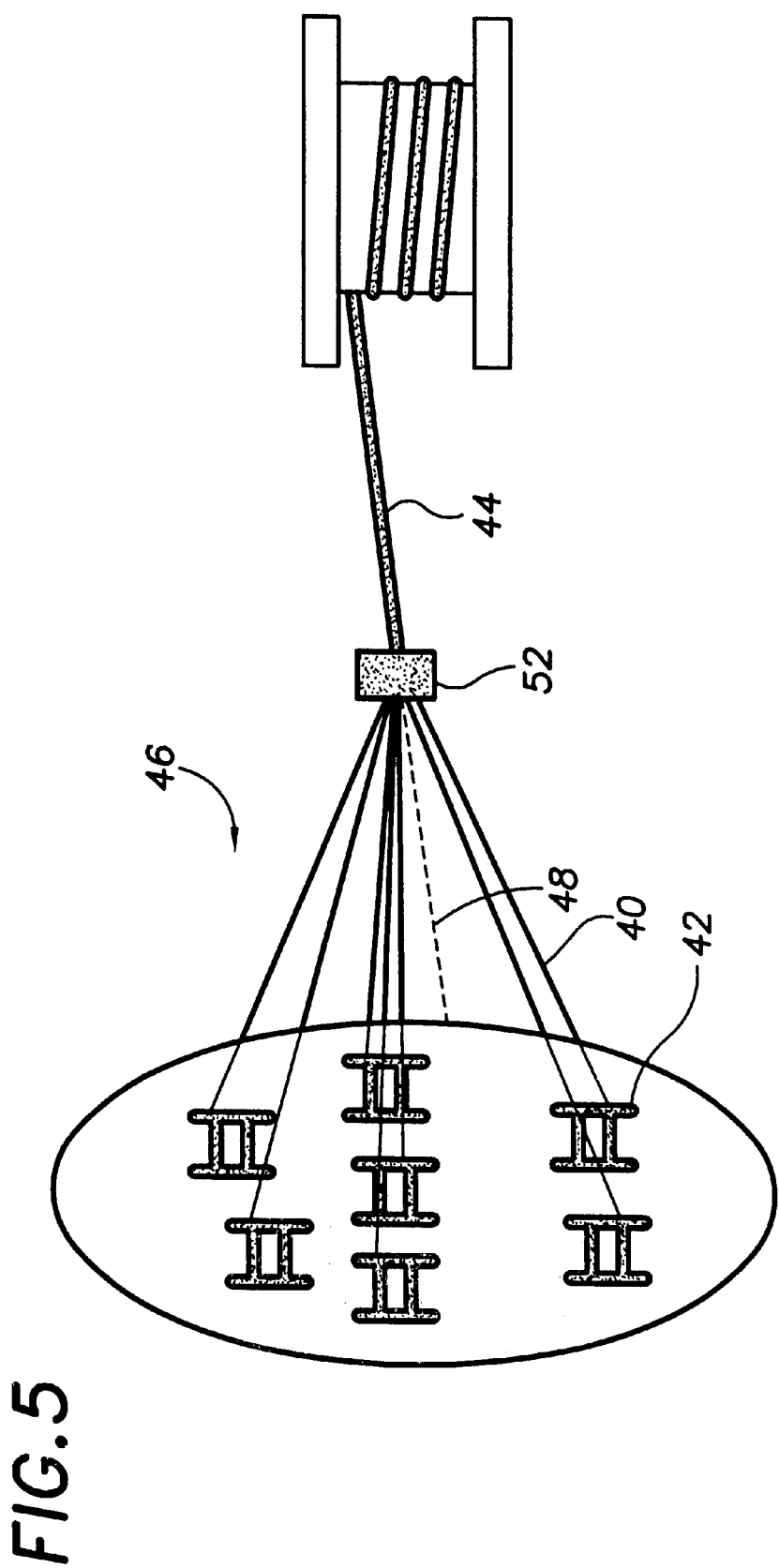
FIG. 5 is a schematic illustration of a cabling operation used in the practice of the invention.

Cable assembly using standard cabling equipment is illustrated in FIG. 5. The strands 40 to be transposed are spooled in equal amounts onto N spools 42, where N is the number of strands to be included in the cable 44. These spools are loaded onto the cabling machine 46, shown schematically in FIG. 5. Each spool had an independent tensioning device to provide uniform tension control on pay-off. The applied strand tension is preferably less than 0.2 of the tensile strength of the strand. The spools rotate together about a common rotation axis 48. In the machine shown in FIG. 5, a planetary control provides the capability to rotate the spool through its centroid about an axis parallel to the rotation axis. In this configuration, the same side of the strand always faces the same direction in the cable. The cable may also be made on rigid cabling machines.

Each of the spools pays off to a "gathering point" located on the common rotation axis. The setting die at the gathering point 52 defines the cable cross section. The rate that the cable is pulled through the gathering point relative to the rotation rate around the common axis defines the cable lay pitch.

The cable may be formed in a variety of alternative configurations. For example, round filaments may be stranded concentrically, or as bunched or rope lay. Concentric stranding has several different possibilities for the lay direction and lay length between layers. Bunched stranding has a common lay direction and lay length applied to a number of strands without regard for the geometric arrangement of individual strands. Rope lay is a higher order cable of either bunched or concentric stranded members. It is also within the scope of the invention to create higher order cables by cabling individual strands and using those cable in a second cabling operation (i.e., cabling the cables). These higher order cable composites may also be coated according to the invention.

Figure 6:
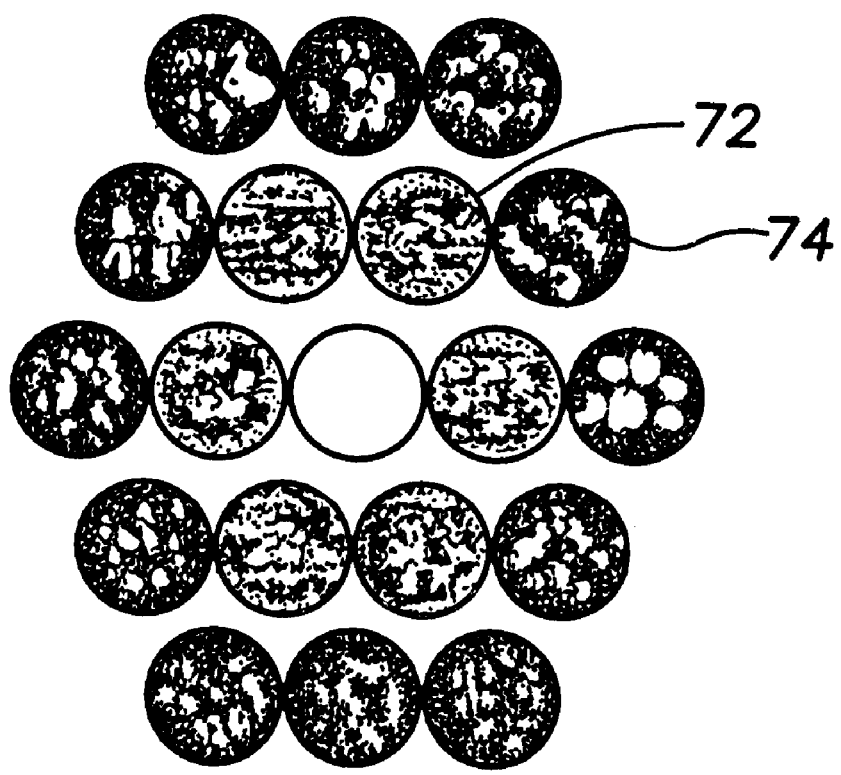
FIG. 6 is a schematic illustration of a concentric cable cross section.

FIG. 6 is a schematic illustration of a concentric cable cross section, in which the lightly hatched area 72 and darkly hatched area 74 represent strand layers having different lay pitch lengths and lay pitch directions. Tight cables can be formed by specifying a short lay pitch and sizing the cable through a die smaller than the net diameter of the as-assembled cable. The assembled cable may be further drawn to smaller diameters without metallurgical bonding between the individual strands. Such drawing eliminates voids between strands and is a much simpler way to achieve full density than stacking hexagonal cross section shaped strands in a twisted configuration. The drawn cable then is immersed in solder bath as described hereinabove to coat the filaments strands of the cable and the entire assembly is then heated at about the melting temperature of the ductile predecessor material to bond the cable strands together.

Depending on the composition of the desired oxide superconductor, it may be desirable to deformation texture the article. When the desired superconductor oxide is BSCCO 2223 (and the intermediate oxide is BSCCO 2212) deformation texturing is desirable. When the desired oxide superconductor is BSCCO 2212 or ReBCO oxides, texturing using reaction induced techniques (RIT) are preferred.

The coated cabled article may then be asymmetrically and/or symmetrically deformed in order to crystallographically align the oxide superconductor precursor grains in a uniform direction. It is desirable to first assemble the strands into a coated cable and then perform such deformation steps as needed to induce texture. Strands which have already been fully textured can not be subsequently transposed about each other in a manner which maintains proper orientation with the magnetic field for the best $J_c$ and minimum bend strain. When texturing is performed after the cabling operation, the textured filaments have both transposition and proper orientation with an applied magnetic field. See, U.S. Ser. No. 08/554,814, which is herein incorporated by reference, for further discussion of texturing a cabled conductor.

In accordance with known methods, it may be desirable to twist the cable to further reduce AC losses or to induce torsional texture and deformation-induced texturing (DIT) operations, as well has subjecting the cable to heat treatments to convert precursor oxides into the desired oxide conductor and/or to improve current carrying capacity of the oxide superconducting phase.

Any deformation processing and twisting operations should most preferably be carried out prior to conversion of the ductile layer into a metal oxide. The ductile metal coating is co-deformed with the composite and remains an adherent coating throughout the deformation steps. To fully texture the cable, the cable may be mechanically deformed in one or more steps by a non-axisymmetric technique, preferably at conditions sufficient to achieve a high aspect ratio and a packing factor of at least 75% and preferably at least 85% and to texture the filament material. The post cable deformation is accomplished by rolling or additional turks-head rolling. Cold rolling and powered turks-heading is preferred. It is preferred that a total strain of up to 90% be applied in one to 25 passes. Intermediate anneals may be performed to reduce strain hardening of the matrix material, however, it is desirable to keep heat treatments below the melting point of the ductile predecessor coating until such time as conversion into the high resistivity oxide is to occur.

Thereafter, the ductile metal layer may be transformed into the high resistivity layer either in a separate reaction step or during the normal heat treatment schedule of the oxide superconductor. The conversion may take place at any time after texturing deformation. Conversion may be accomplished by heating the coated article in the appropriate atmosphere. For example, the article may be heated in a nitriding atmosphere when it is desired to form a metal nitride layer. Similarly, the article may be heated in a carbonizing, or sulfiding atmosphere to form the corresponding metal carbide or sulfide.

In the instance where the high resistivity layer is a metal oxide, the ductile metal layer should be oxidized without decomposition of the oxide superconductor filament under conditions where oxidation occurs fast enough to be a dominant reaction mechanism (as compared to diffusion) in the composite. High oxygen partial pressure causes oxidation to proceed rapidly, yet the oxygen partial pressure should not be so high as to destablize the oxide superconductor phase. Increased temperature will also speed up oxidation, however, high temperatures also favor diffusion. Thus, the temperature and oxygen partial pressure are desirably balanced to preserve superconducting oxide composition, favor metal oxidation and discourage elemental diffusion.

In one embodiment, conversion of the ductile metal coating into its respective metal oxide occurs in the oxidizing environment of the heat treatment designed for the conversion of precursor oxide BSCCO 2212 into BSCCO 2223. Such conversion may also be part of an overall process to texture and orient the oxide superconductor phase (reaction-induced texture or RIT), however, such a texturing reaction should not typically take place until substantially all mechanically induced texture has been completed. The BSCCO 2212 to BSCCO 2223 conversion typically takes place at temperatures in the range of about 800–830° C. and at low oxygen pressures (0.01 to 10 atm and preferably 0.75 atm). These conditions typically are effective to convert the metal into the corresponding metal oxide. The metal to metal oxide transformation reaction is a kinetics competition between oxidation of the metal coating and interdiffusion of the metal and strand metal matrix (typically silver). During heating at elevated temperatures, the mobility of the metallic elements is increased and the metal of the outer coating may diffuse into the neighboring silver matrix, preventing formation of a discreet oxide layer and possibly impairing the chemical and physical integrity of the oxide superconducting filament. Heating at elevated temperatures may be particularly suitable for conversion to metal oxides of those metals which have a low diffusion rate into the metal matrix. However, a high temperature oxidation may also be suitable for metals which have high diffusivity into the metal matrix by controlling the relative rate of diffusivity of the relevant elements, e.g., silver, predecessor metal and oxygen.

Even in situations where the relative diffusion and oxygen rates do not favor efficient oxidation of the metal into the corresponding metal oxide over diffusion, metal oxidation can be promoted and metal diffusion discouraged by appropriate selection of oxidizing conditions. In one embodiment of the invention, conversion of the metal layer to an oxide is accomplished under conditions of high oxygen activity, such as superatmospheric oxygen partial pressure ($P_{O2}$), and reduced temperature. The reduced temperature decreases the mobility of the metallic elements, while the high oxygen activity promotes the conversion to a metal oxide by increasing mass transport of oxygen to the metal layer. Suitable high oxygen pressure for the conversion of the metal layer to a metal oxide is in the range of about 10–200 atm $O_2$ and more preferably in the range of about 50–200 atm $O_2$ and most preferably in the range of 80–120 atm $O_2$. The total gas pressure may be in the range of up to about 4000 atm $O_2$, where the balance of the gas is an inert gas such as nitrogen or argon. Enhanced total pressure is useful to prevent local strain/stress splitting of the superconducting cable due to volume change associated with the oxidation process. Suitable oxidation temperatures are in the range of about 400–700° C. Interested readers are directed to U.S. Pat. No. 5,472,521, which is herein incorporated by reference, for further detail on high pressure oxidation reactions.

It is contemplated that other metal/metal oxide systems could be similarly treated using the principles and methods described above. After conversion of the coating to an oxide, additional small asymmetric deformation strains (up to about 40%) are possible without damaging (destroying continuity) the oxide layer.

After texturing and conversion heat treatments are complete, a final heat treatment may be performed under conditions suitable for healing strain-induced cracks in the filament material. For most oxide superconducting composites, the critical current is independent of the amount of tensile strain applied on the composite until the strain reaches a threshold value. Above that threshold, the critical current decreases asymptotically with increasing tensile strain due to the formation of localized microcracks in the filament material. A melt-textured growth technique such as that described by Kase et al. in *IEEE Trans. Mag.* 27(2):1254 (1991) may be used for crack-healing in BSCCO 2212. Suitable final heat treatment processes for BSCCO 2223 are described for example in co-pending applications U.S. Ser. No. 08/041,822 filed Apr. 1, 1993 and entitled "Improved Processing for Oxide Superconductors", U.S. Ser. No. 08/198,912, filed Feb. 17, 1994 and also entitled "Improved Processing for Oxide Superconductors" and U.S. Ser. No. 08/553,184 filed on Nov. 7, 1995 and entitled "Processing of Oxide Superconducting Cables", all herein incorporated by reference.

Cables of the invention have been tested for AC loss in alternating magnetic fields. The samples demonstrated decreasing AC losses with an increase in $J_c$. Further, the AC losses are promisingly low (<10 mW/A-m for a 0.1 T rms) for composites having closely spaced oxide filaments. Various superconducting articles, such as coils, may be fabricated from the cables of the present invention.

The invention is described with reference to the following examples, which are presented for the purposes of illustration only and which is in no way intended to be limiting of the invention. Those skilled in the art will recognize or be able to ascertain using no more than routine experimentation, many equivalents to the specific embodiments of the invention described specifically herein. Such equivalents are intended to be encompassed in the scope of the following claims.

Fine Wire Monofilament Formation

Precursor powders were prepared form the solid state reaction of freeze-dried precursors of the appropriate metal nitrates having the nominal composition of 1.8:0.3:1.9:2.0:3.1 (Bi:Pb:Sr:Ca:Cu). The corresponding metal oxide powders could also be readily used. After thoroughly mixing the powders in the appropriate ratio, a multistep treatment (typically 3–4 steps) of calcination (800° C.±10° C. for a total of 15 h) and intermediate grinding was performed in order to remove residual carbon, homogenize the material and generate a BSCCO 2212 oxide superconductor phase.

The powders were packed into silver sheaths having an inner diameter of 0.850" (2.16 cm) and a length of 8" (20.32 cm) and an outer diameter of 1.25" (3.18 cm) to form a billet. The billets were drawn in a series of steps to a diameter of 0.05" (1.27 mm). The wire was further drawn to the desired fine wire dimension in a multi-die, full-slip drawing operation. Processing at about a 10% reduction in cross sectional area per pass at about a 12° die angle (with nominal back tension) provided monofilament strands having filament dimensions of about 0.62 mm. Annealing at about 300° C. for 5–30 minutes were performed occasionally to soften the silver matrix.

EXAMPLE 1

This example demonstrates the preparation of a coated cabled composition using a BSCCO-2223 oxide superconductor in a silver matrix by coating a monofilament strand before cabling.

Monofilament strands of a precursor oxide to BSCCO-2223 (BSCCO-2212 plus secondary phases in a silver sheath) were fine wire drawn as described above to a 0.62 mm diameter. The wire was cleaned, fluxed using Flux 260-Hf (Alpha Metals) for about 3 min. and passed through a soldering pot filled with molten staybrite solder and wiped on exiting the bath. The result was a uniform staybrite coating on the surface of the monofilament nominally 1–4 μm thick, depending on coating conditions. This coated wire was cut into seven equal lengths and cabled into a "6 around 1" configuration at a diameter of nominally 1.7 mm. The cable was further drawn to a diameter of 1.45 mm, re-passed through the soldering pot, and rewiped to bond the strands together. The bath provided ideal high heat capacity, controlled uniform temperature and atmosphere to bond the monofilament strands.

The bonded filaments were further drawn to 0.9 mm. The staybrite coating co-deformed with the monofilaments and a uniform, nominally 1–2 μm thick staybrite layer remained between the monofilaments and on the surface of the composite. The cable was robust enough to withstand the drawing process.

Figure 7:
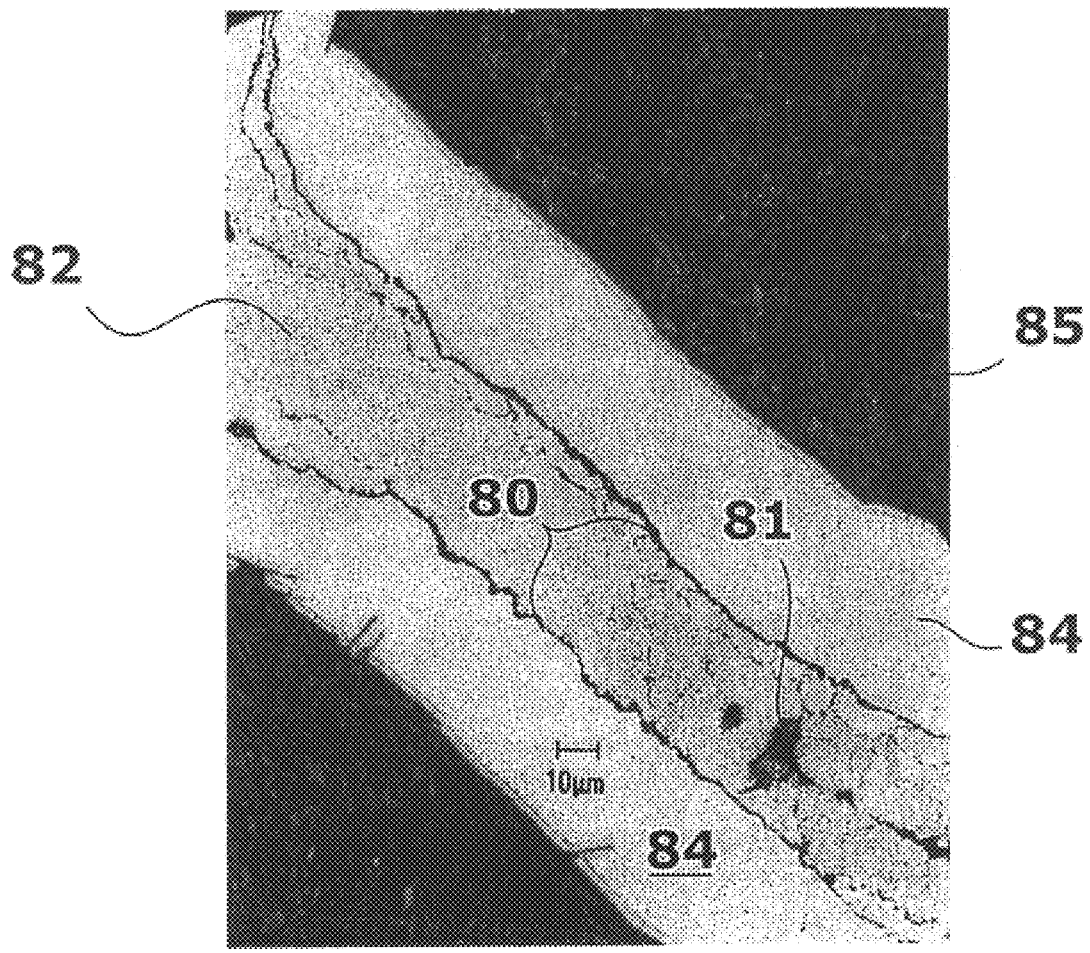
FIG. 7 is a light photomicrograph of a cable cross section after a heat treatment to convert the AgSn layer into $SnO_2$.

The composite was then heated to convert the staybrite coating to $SnO_2$ during the heat treatment to convert BSCCO-2212 into BSCCO-2223. The heat treatment consisted of a first heat treatment at 827° C. in 7.5% $O_2$ for 24 hours, followed by rolling to a thickness of ca. 0.0153", and then heating at 827° C. (40 h), 808° C. (40 h), 724° C. (30 h), all at 0.075 atm $O_2$ (balance $N_2$). The heat treatment resulted in an oxide layer as shown in FIG. 7.

The formation of the tin oxide layer proceeds through the intermediate formation of an intermetallic phase, denoted at the ζ-phase. When the staybrite eutectic alloy is bonded to an excess of silver, the ζ-phase forms at the silver-staybrite interface. (The ζ-phase forms readily and the article is maintained at low temperature, e.g., less than 210° C., to avoid formation.) The staybrite layer is transformed into $SnO_2$ layers at the ζ-phase-Ag interface after a first heat treatment at 827° C. (0.75 atm $O_2$). FIG. 7 is a light photomicrogragh of a cross-sectional area of three monofilament in a cable of the invention. Under these conditions, tin diffuses readily out of the ζ-phase and into the silver phases facing both sides of the layer, resulting in two well-defined tin oxide layers 80 separated by silver 82, as shown in FIG. 7. The interstice of the three coated monofilaments is indicated at 81. The resultant oxide layers 80 are tenacious and continuous. There is a wide band of silver 84 separating oxide filament 85 from the metal oxide layer 80, thus insuring both an electrical shunt adjacent to the filament and a physical barrier against tin contamination of the filament. Energy dispersive X-ray analysis detected no tin in the silver layers 82, 84 and no silver in the $SnO_2$ layer 80; however, discreet regions of tin oxide have sometimes been observed in the silver matrix. While tin from the ζ-phase may diffuse into silver, the reported diffusivity of tin into silver is quite slow. It is thought that oxidation of the ζ-phase to Ag and $SnO_2$ occurs much faster that tin diffusion into silver at elevated temperatures. Thus, even though silver adjacent to the ζ-phase may hold up to 10 wt % tin, oxidation of the tin occurs faster than its diffusion into silver. The oxidation is assisted by rapid oxygen diffusion through the silver matrix and there is complete transformation of the tin into $SnO_2$ with limited diffusion of Sn to the filament-Ag interface.

EXAMPLE 2

This example demonstrates the preparation of a coated cabled composition using a BSCCO-2223 oxide superconductor in a silver matrix by coating a cabled composite.

Monofilament strands of a precursor oxide of BSCCO 2223 (BSCCO 2212 in a silver sheath) were fine wire drawn to a 0.62 mm diameter. This wire was cut into seven equal lengths and cabled into a "6 around 1" configuration (0.745"

lay pitch, set die 0.0679" φ) to provide a cable composite with a diameter of nominally 1.7 mm. The cable was further drawn through two die passes (with back tension) to a diameter of 1.45 mm, was annealed for 15 min. at 300° C. and was then twisted and drawn to 1.3 mm (0.0523" ) diameter. The cable was tightly twisted to transpose the filaments without degradation of filament uniformity. The composite was twisted with a twist pitch up to 2.8 mm (twist strain of about 1), which is more than adequate for the envisioned needs, even considering that the elongation in the roll deformation of the final tape will more than double the length of the actual lay pitch.

The cable composite was prepared for coating by cleaning in hexane (ca. 3 min.) and fluxing using Flux 260-Hf (Alpha Metals) for about 3 min. The cable was passed through a soldering pot filled with staybrite solder and wiped on exiting the bath. The result was a uniform staybrite coating on the surface of the each strand within the cable, nominally 1–4 μm thick, depending on coating conditions, as shown in FIG. 6.

The coated cable further deformed using power turks head to a cross section of about 0.9 mm×1.4 mm (0.035"×0.053") and rolled to a thickness of about 0.45 mm (0.018"). The staybrite coating co-deformed with the monofilament strands and a uniform, nominally 1–2 μm thick staybrite layer remained between each strand and on the surface of the composite.

Figure 8:
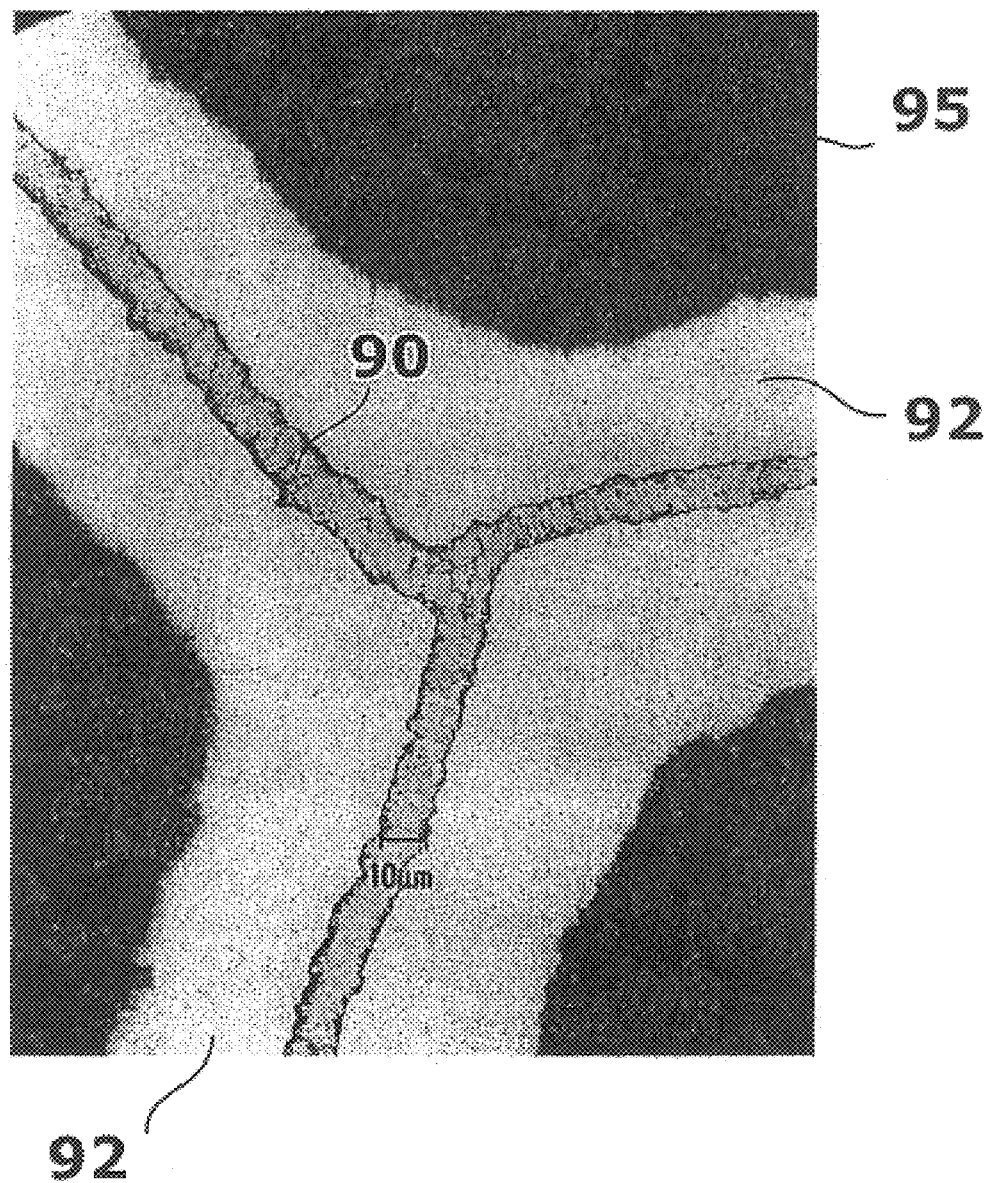
FIG. 8 light photomicrograph of a cable cross section after a heat treatment to convert the AgSn layer into $SnO_2$.

The composite was then heated to convert the staybrite coating to $SnO_2$ during the heat treatment to convert BSCCO-2212 into BSCCO-2223. The heat treatment consisted of a first heat treatment at 827° C. in 7.5% $O_2$ for 24 hours, followed by rolling to a thickness of ca. 0.4 mm (0.0153"), and then heating at 827° C. (40 h), 808° C. (40 h), 724° C. (30 h), all at 0.075 atm $O_2$ (balance $N_2$). The heat treatment resulted in an oxide layer as shown in FIG. 8. The $SnO_2$ layer appears adherent and continuous. No spalling of the $SnO_2$ on the surface is observed.

EXAMPLE 3

This example demonstrates the preparation of a coated cabled composition using a BSCCO-2223 oxide superconductor in a silver matrix by coating a cabled composite and a high oxygen pressure oxidation step.

Monofilament strands of a precursor oxide of BSCCO-2223 (BSCCO-2212in a silver sheath) were fine wire drawn to a 0.62 mm diameter. This wire was cut into seven equal lengths and cabled into a "6 around 1" configuration (0.745" lay pitch, set die 0.0679" φ) to provide a cable composite with a diameter of nominally 1.7 mm. The cable was further drawn through two die passes (with back tension) to a diameter of 1.45 mm, was annealed for 15 min. at 300° C. and was then twisted and drawn to 1.3 mm (0.0523") diameter.

The cable composite was prepared for coating by cleaning in hexane (ca. 3 min.) and fluxing using Flux 260-Hf (Alpha Metals) for about 3 min. The cable was passed through a soldering pot filled with staybrite solder and wiped on exiting the bath. The result was a uniform staybrite coating on the surface of the each strand within the cable, nominally 1–4 μm thick, depending on coating conditions.

The coated cable further deformed using power turks head to a cross section of about 0.9 mm×1.4 mm (0.035"×0.053") and rolled to a thickness of about 0.45 mm (0.018"). The staybrite coating co-deformed with the monofilament strands and a uniform, nominally 1–2 μm thick staybrite layer remained between each strand and on the surface of the composite.

The composite was then heated to convert the staybrite coating to $SnO_2$ using a high pressure oxygen heat treatment at 600° C. under 100 atm of pure $O_2$ for 3 hours. Thereafter, the filament oxide was heated to convert BSCCO 2212 into BSCCO 2223. The heat treatment consisted of a first heat treatment at 827° C. in 7.5% $O_2$ for 24 hours, followed by rolling to a thickness of ca. 0.4 mm (0.0153"), and then heating at 827° C. (40 h), 808° C. (40 h), 724° C. (30 h), all at 0.075 atm $O_2$ (balance $N_2$). The heat treatment resulted in an oxide layer.

Figure 9:
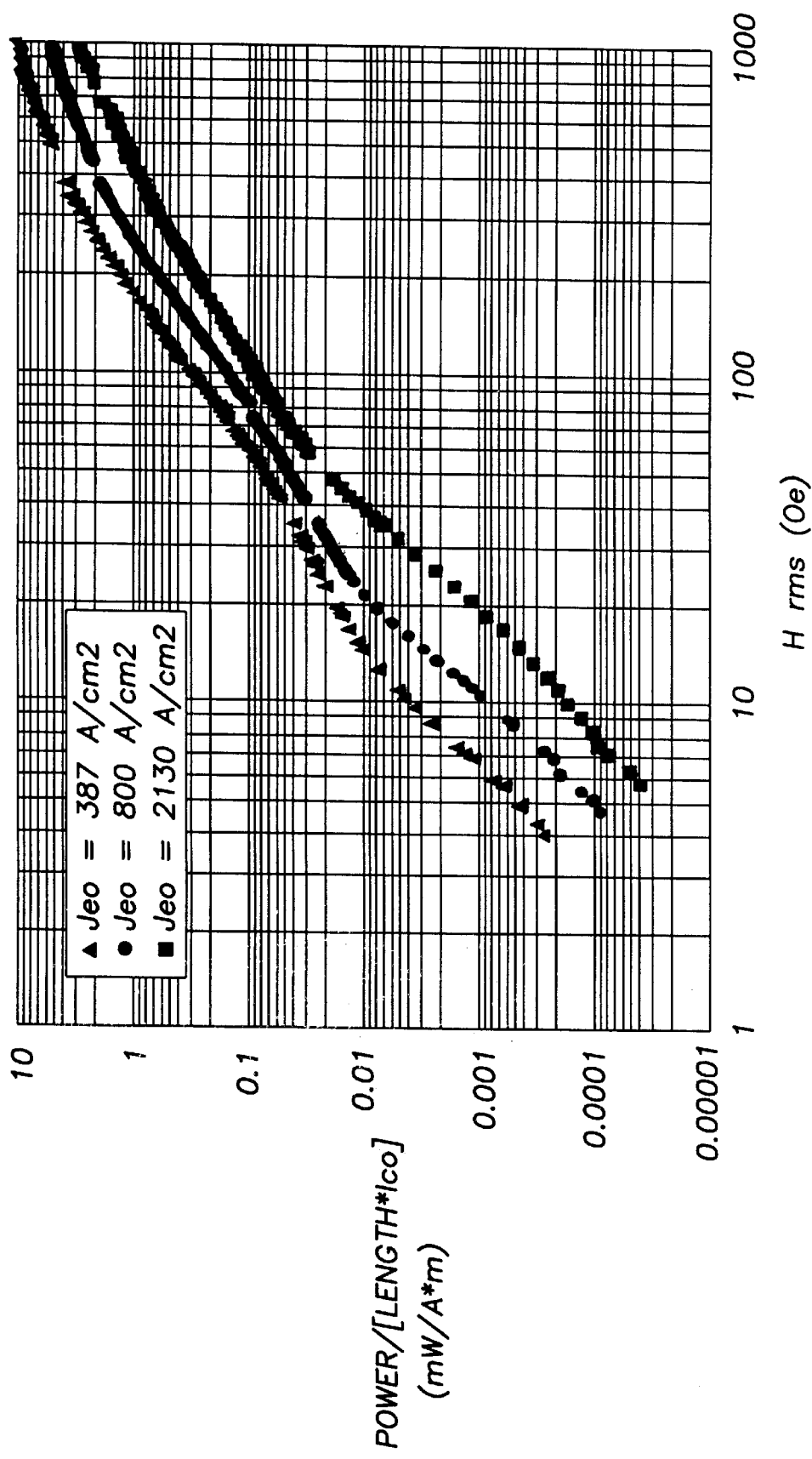
FIG. 9 is a plot of AC loss (power/[length*$I_{CO}$]) v. alternating field strength (H oersteds) for cables of the varying $J_e$.

A light photomicrograph of a cross-sectional area of a coated cable heat treated at 600° C. in 100 atm pure $O_2$ is shown in FIG. 8. The formation of a tin oxide layer 90 under high oxygen pressure conditions also proceeds through the ζ-phase. At higher oxygen activity and lower temperatures, however, the diffusion of tin into the silver phase 92 is significantly reduced. As shown in FIG. 8, the tin oxide layer 90 is well-defined and appears to have formed substantially in the same location as the original metal layer. Although it appears in FIG. 9 that a single metal oxide layer has formed, two closely-spaced adjacent metal oxide layers are often observed. The resultant oxide layer 90 is tenacious and continuous. Energy dispersive X-ray analysis detected no tin in the silver and no silver in the $SnO_2$; however, discreet regions of tin oxide have sometimes been observed in the silver matrix. There is a much wider band of silver 92 separating the oxide filament 95 from the metal oxide layer, thus insuring both an electrical shunt adjacent to the filament and a barrier against tin contamination of the filament.

EXAMPLE 4

This example presents preliminary AC loss measurements. Lengths of final heat treated cables were measured for critical current ($I_c$) at 77K(0) at a voltage criterion of 1 μvolt/cm. $J_e$ was established by dividing the $I_c$ by the cross sectional area of the cable. Adjacent samples were sectioned into nominally 1" long lengths. The end of each 1" section was sanded dry on sand paper of consecutively smaller grit sizes down to 1200 grit. The sanding was to ensure that the filaments did not have a physical link between them as a result of damage due to cutting.

For each sample measured, a pick-up coil was placed around two pieces such that the coil had an effective cross sectional area almost identical to a section through each of the two pieces. This measured cross section is represented by a plane that is normal to the wide dimension of the cable and parallel to the length axis of the cable. The sample and pick-up coil were placed in an alternating magnetic field at 77K. The voltage induced in the coil is related to the loss in the sample. The AC loss is plotted in FIG. 9.

Though results are preliminary, it is seen that AC losses on a mW/A-m scale (the commercial unit of measure) decrease with increasing $J_e$. Also, the Ac losses (<10 mW/A-m) for 0.1 T rms, a magnetic field for commercial applications) are promisingly low for a composite with filaments so closely spaced (the fraction of superconductor is nominally 0.40).

Other embodiments of the invention will be apparent to the skilled in the art from a consideration of the specification or practice of the invention disclosed herein. It is intended that the specification and examples be considered as exemplary only with the true scope and spirit of the invention being indicated by the following claims.

What is claimed is:

1. An oxide superconducting cable, comprising:
   a plurality of strands, each comprising at least one oxide superconductor filament sheathed in a ductile and conductive metal matrix, at least half of strands further comprising an adherent, substantially continuous high resistivity coating having a thickness in the range of about 1 μm to about 5 μm substantially surrounding said strand, wherein the strands are positioned and arranged to form a cable.

2. The oxide superconducting cable of claim 1, wherein each said strand is substantially surrounded by the high resistivity coating.

3. The oxide superconducting cable of claim 2, wherein the high resistivity coating is diffusion bonded to each said strand.

4. The oxide superconducting cable of claim 2, wherein the high resistivity coating of each said strand is diffusion bonded to a neighboring strand.

5. The oxide superconducting cable of claim 2, wherein the high resistivity coating comprises a metal oxide.

6. The oxide superconducting cable of claim 5, wherein the metal oxide is selected from the group consisting of oxides of tin, bismuth, gallium, antimony, zinc, iron, nickel, niobium, tantalum, zirconium and indium and alloys thereof with each other and silver.

7. The oxide superconducting cable of claim 2, wherein the coating has a thickness in the range of about 1 μm to about 5 μm.

8. The oxide superconducting cable of claim 2, wherein the strand is a monofilament.

9. The oxide superconducting cable of claim 2, wherein the strand is a pre-assembled cable.

10. The oxide superconducting cable of claim 2, wherein the high resistivity coating has a resistance greater than about 10 μΩ-cm.

11. The oxide superconducting cable of claim 2, wherein the oxide superconductor filament has a diameter of less than 250 μm.

12. The oxide superconducting cable of claim 2, wherein the strands are positioned and arranged so as to form a cable selected from the group consisting of concentric, bunched and rope lay cables and higher order cables form therefrom.

13. The oxide superconducting cable of claim 2, characterized in that the AC losses at an alternating magnetic field of 0.1 T rms is less than about 10 mW/A-m.

14. The cable of claim 13 wherein the strand has a superconducting volume fraction of about 0.1 to about 0.5.

15. The cable of claim 14, wherein the strand has a superconducting oxide volume fraction of about 0.25 to about 0.4.

16. The oxide superconducting cable of claim 2, wherein the high resistivity layer comprises two substantially continuous layers having a conductive metal layer disposed therebetween.

17. The oxide superconducting cable of claim 2, wherein non-continuous domains of the high resistivity material are dispersed within the conductive metal matrix.

18. The oxide superconducting cable of claim 2, wherein the cable has an aspect ratio of greater than one.

19. A superconducting coil fabricated from the cable of claim 1.

20. A cable, comprising:

a plurality of strands, each comprising at least one filament comprising a precursor to an oxide superconductor sheathed in a ductile and conductive metal matrix, at least half of said strands further comprising an adherent, substantially continuous metal coating on the outer surface of said strands, said metal coating capable of conversion into a high resistivity material having a thickness in the range of about 1 μm to about 5 μm, wherein the strands are positioned and arranged to form a cable.

21. The cable of claim 20, wherein the cable has an aspect ratio of greater than one.

22. The cable of claim 20, wherein the metal coating is selected from the group consisting of tin, bismuth, gallium, antimony, zinc, iron, nickel, niobium, tantalum, zirconium and indium and alloys thereof with each other and silver.

23. A cable, comprising:

a plurality of strands, each comprising at least one filament comprised of a precursor to an oxide superconductor sheathed in a silver alloy matrix, at least one of said strands further comprising an adherent, substantially continuous silver-based intermetallic material coating on the outer surface of said strand, said intermetallic material capable of conversion into a high resistivity material having a thickness in the range of about 1 μm to about 5 μm, wherein the strands are positioned and arranged to form a cable.

24. The cable of claim 23, wherein the cable has an aspect ratio of greater than one.

25. The cable of claim 23, wherein the intermetallic compound is a silver metal compound selected from the group consisting of tin, bismuth, gallium, antimony, zinc, iron, nickel, niobium, tantalum, zirconium and indium.

26. An oxide superconducting strand, comprising:

at least one oxide superconductor filament sheathed in a ductile and conductive metal matrix; and an adherent high resistivity coating having a thickness in the range of about 1 μm to about 5 μm and substantially surrounding the outer surface of the sheathed filament.

27. The oxide superconducting strand of claim 26, wherein the high resistivity coating is diffusion bonded to the outer surface of the sheathed filament.

28. The oxide superconducting strand of claim 26, wherein the high resistivity coating is an oxide of a metal selected from the group consisting of tin, bismuth, gallium, antimony, zinc, indium, iron, nickel, niobium, tantalum, zirconium and alloys thereof with each other and silver.

29. The superconducting strand of claim 26, wherein the strand is a monofilament.

30. The superconducting strand of claim 26, wherein the strand is a multifilament.

31. The superconducting strand of claim 26, wherein the high resistivity coating has a resistance in the range of about 100 μΩ-cm to about 1 Ω-cm.

32. The superconducting strand of claim 26, wherein the oxide superconductor filament has a diameter of less than 250 μm.

33. A method of preparing an oxide superconducting cable having a high transverse matrix resistivity, comprising:

(a) applying a ductile predecessor coating to a plurality of strands, each said strand comprised of at least one oxide superconductor filament or a precursor thereto sheathed in a ductile and conductive metal matrix, wherein the ductile predecessor material is capable of conversion into a high resistivity material;

(b) assembling the plurality of strands into a cable; and (c) converting the ductile predecessor material into a high resistivity material to form a coating that permits current sharing among oxide superconductor filaments within the oxide superconducting cable, where steps (a) and (b) can be performed in any order.

34. A method of preparing an oxide superconducting cable having a high transverse matrix resistivity, comprising:

(a) cabling a plurality of strands, each said strand comprised of at least one oxide superconductor filament or a precursor thereto sheathed in a conductive metal matrix;

(b) contacting the cable with a ductile predecessor so as to form a ductile predecessor layer on the cable strands, wherein the ductile predecessor material is capable of conversion into a high resistivity material; and (c) converting the ductile predecessor material into a high resistivity material to form a coating that permits current sharing among oxide superconductor filaments within the oxide superconducting cable.

35. The method of claim 34, wherein the ductile predecessor is a metal or metal alloy.

36. The method of claim 35, wherein the ductile predecessor is selected from the group consisting of tin, indium, gallium, bismuth, iron, nickel, niobium, tantalum, zirconium and alloys thereof with themselves and with silver.

37. The method of claim 35, wherein the step of conversion of the ductile predecessor into a high resistivity material comprises oxidizing the metal into the corresponding metal oxide.

38. The method of claim 35, wherein the ductile predecessor layer is applied by contacting the filaments with the ductile predecessor in a molten or liquid form.

39. The method of claim 35, wherein the ductile predecessor layer is applied by a technique selected from the group consisting of electroplating, ion implantation, physical vapor deposition, electroless deposition.

40. The method of claim 35, wherein the strand comprises a monofilament oxide superconductor or precursor thereto.

41. The method of claim 35, wherein the filament has a diameter of less than 250 $\mu$m.

42. The method of claim 35, further comprising:

heating the coated cable after assembly of the cable to adhere the strands to each other.

43. The method of claim 35, wherein the step (c) is carried out at superatmospheric oxygen pressures and at a temperature sufficient to convert to the ductile predecessor into a high resistivity material.

44. The method of claim 43, wherein the oxygen pressure is in the range of 15–3000 psi.

45. The method of claim 43, wherein the total pressure is in the range of about 15–60,000 psi.

46. The method of claim 43, wherein the temperature is in the range of about 400° C. to about 700° C.

47. The method of claim 35, wherein the step (c) is carried out under conditions additionally sufficient to convert the oxide superconductor precursor to the oxide superconductor.

48. The method of claim 35, further comprising:

heating the cable with high resistivity coating under conditions sufficient to convert the oxide superconducting precursor to the oxide superconductor.

49. The method of claim 43, further comprising:

heating the cable with high resistivity coating under conditions sufficient to convert the oxide superconducting precursor to the oxide superconductor.

50. The method of claim 35, wherein the layer is in the range of about 1 to 5 $\mu$m.

51. The method of claim 35, wherein the high resistivity material has a resistance in the range of about 100 $\mu\Omega$-cm to about 1 $\Omega$-cm.

52. The method of claim 35, further comprising:

subjecting the cable to deformation processing sufficient to texture the oxide superconductor or precursor thereto, said deformation processing occurring prior to step (c) conversion of the ductile predecessor into a high resistivity material.

53. The method of claim 52, wherein the deformation processing is selected from the group consisting of rolling, pressing, turks heading, drawing, extruding and twisting.

54. The method of claim 35, further comprising:

twisting the strand prior to the cabling step (a).

55. The method of claim 35, further comprising:

subjecting the high resistivity coated cable to a heat treatment selected to heal microcracks in the oxide superconductor.

56. The method of claim 52, further comprising:

subjecting the high resistivity coated cable to a heat treatment selected to heal microcracks in the oxide superconductor.

* * * * *